United States Patent [19]

Samani

[11] Patent Number: 5,587,677
[45] Date of Patent: Dec. 24, 1996

[54] COMBINED CMOS AND NPN OUTPUT PULL-UP CIRCUIT

[75] Inventor: Davoud Samani, Saint Martin Le Vinoux, France

[73] Assignee: SGS-Thomson Microelectronic S.A., Saint Genis Pouilly, France

[21] Appl. No.: 359,700

[22] Filed: Dec. 20, 1994

[30] Foreign Application Priority Data

Dec. 23, 1993 [EP] European Pat. Off. .............. 93420510

[51] Int. Cl.$^6$ ........................................................ H03K 5/12
[52] U.S. Cl. .......................... 327/108; 327/112; 327/170; 327/376; 327/433
[58] Field of Search ................................. 327/112, 433, 327/108, 170, 376

[56] References Cited

U.S. PATENT DOCUMENTS

| | | | |
|---|---|---|---|
| 4,103,188 | 7/1978 | Morton | 327/433 |
| 5,126,588 | 6/1992 | Reichmeyer et al. | 327/112 |
| 5,140,190 | 8/1992 | Yoo et al. | 326/84 |
| 5,173,623 | 12/1992 | Chau et al. | 326/84 |
| 5,237,213 | 8/1993 | Tanoi | 307/290 |
| 5,276,364 | 1/1994 | Wellheuser | 307/475 |

FOREIGN PATENT DOCUMENTS 0553020  7/1993  European Pat. Off. ....... H03K 19/01

*Primary Examiner*—Margaret Rose Wambach
*Attorney, Agent, or Firm*—David M. Driscoll; James H. Morris

[57] ABSTRACT

A pull-up circuit including an NPN bipolar transistor, a P-MOS transistor connected in parallel with the bipolar transistor, a first CMOS inverter for receiving an input signal and controlling the P-MOS transistor, and a second CMOS inverter for receiving the output of the first inverter and controlling the bipolar transistor. An output stage includes the pull-up circuit and also includes a pull-down circuit comprising an N-MOS transistor, a second NPN bipolar transistor connected in parallel with the N-MOS transistor, a control circuit for switching on the second NPN bipolar transistor, and a third inverter whose input is connected to the output terminal and whose output controls the N-MOS transistor and provides a signal to the control circuit for switching off the second NPN bipolar transistor.

36 Claims, 3 Drawing Sheets

COMBINED CMOS AND NPN OUTPUT PULL-UP CIRCUIT

BACKGROUND OF THE INVENTION

1. Field of the Invention

The invention relates to a combined CMOS and NPN output pull-up circuit, and more particularly to such a circuit for use with Transiently-Saturated Full-Swing BiCMOS (TS-FS-BiCMOS) circuits.

2. Discussion of the Related Art

A TS-FS-BiCMOS circuit is an output stage that enables high-speed full-swing operation at a supply voltage of less than approximately 2 V. Such a circuit is reported in: IEEE JOURNAL OF SOLID-STATE CIRCUITS. VOL.27, NO.11, NOVEMBER 1992, p. 1568 Hiraki et Al.

In this circuit, one wants to achieve fast output switching times with full-swing operation. In order to achieve fast output switching, output bipolar transistors must be used and in order to realize full-swing operation, output MOS transistors must be used. This circuit achieves fast output switching with full-swing operation by connecting the respective output bipolar and output MOS transistors in parallel.

To achieve an output logic state transition, the appropriate bipolar transistor is saturated i.e. fully conducting, until its respective MOS transistor is fully conducting, at which point, the bipolar transistor is turned off and it is the respective MOS transistor that provides the steady state output voltage; hence the term 'Transiently-Saturated Full-Swing'.

FIG. 1 illustrates a detailed circuit diagram of a TS-FS-BiCMOS circuit as taught by the aforementioned article. It includes two CMOS command stages 10 and 12. Command stage 10 provides a transient control signal to the base terminal 14 of an output pull-up PNP bipolar transistor TP1. Command stage 12 provides a transient control signal to the base terminal 16 of an output pull-down NPN bipolar transistor TN1. The emitter terminals of the bipolar transistors TP1 and TN1 are connected to a positive supply rail V+ and a negative supply rail V−, respectively, whilst their collector terminals are both connected to an output terminal Vout.

Command stage 10 comprises two parallel connected P-MOS transistors MP1 and MP2 and two series-connected N-MOS transistors MN1 and MN2. The sources of transistors MP1 and MP2 are connected to the positive voltage supply rail V+ whilst their drains 14 are connected to the base of the bipolar transistor TP1 and the drain of transistor MN1. The source 20 of transistor MN1 is connected to the drain of transistor MN2 whose source is connected to the negative voltage supply rail V−. The gates of transistors MP1 and MN1 are connected to an input terminal Vin. The gates of transistors MP2 and MN2 both receive a feedback signal Vfb. Transistors MP1 and MN1 are connected in such a manner that they form an inverter 21, the output of which controls transistor TP1.

Command stage 12 includes two series connected P-MOS transistors MP3 and MP4 and two parallel connected N-MOS transistors MN3 and MN4. The sources of transistors MN3 and MN4 are connected to the negative supply rail V− whilst their drains 16 are connected to the base of the bipolar transistor TN1 and the drain of transistor MP4. The source 22 of transistor MP4 is connected to the drain of transistor MP3 whose source is connected to the positive supply rail V+. The gates of transistors MP4 and MN4 are also connected to the input terminal Vin. The gates of transistors MP3 and MN3 also receive the feedback signal Vfb. Transistors MP4 and MN4 are connected in such a manner that they form an inverter 23, the output of which controls transistor TN1.

An output latch 18 includes two CMOS inverters 24 and 26.

Inverter 24 comprises an N-MOS transistor MN6 and a P-MOS transistor MP6 connected between the supply rails V− and V+. The gate terminals of transistors MN6 and MP6 are connected together to form the input of inverter 24, whilst their respective drain terminals are connected together to form its output.

Inverter 26 comprises an N-MOS transistor MN5 and a P-MOS transistor MP5 connected between the supply rails V− and V+. The gate terminals of transistors MN5 and MP5 are connected together to form the input of inverter 26, whilst their respective drain terminals are connected together to form its output.

The output Vout is connected to the input of inverter 24 and the output of inverter 26. The output of inverter 24 is connected to the input of inverter 26 and provides the feedback signal Vfb.

The operation of the circuit of FIG. 1 will now be described.

Due to the symmetry of the two command stages, only the pull-up operation of command stage 10 will be described in detail, since the pull-down operation (command stage 12) is easily deduced thereupon by one skilled in the art.

Firstly, assume that the voltage at the input Vin is held at a steady low state i.e. approximately V−. The output Vout is then also at a steady low state. Thus, it can clearly be seen that the output Vfb of inverter 24 is held at a steady high state i.e. approximately V+.

With reference to command stage 10, transistors MP1 and MN2 are on i.e. conducting, and transistors MP2 and MN1 are off i.e. non-conducting. Transistor MP1 provides a low impedance path between its source and drain i.e. between the positive supply rail V+ and the base 14 of transistor TP1. Therefore, transistor TP1 is off and provides a high impedance path between its emitter and collector i.e. between the positive supply rail V+ and the output Vout. Transistor MN2 provides a low impedance path between the negative supply rail V− and the source 20 of transistor MN1. Transistor MN1 provides a high impedance path between the positive and negative supply rails, respectively V+ and V−. The output Vout is held low by transistor MN5 of inverter 26, whose input is held high by transistor MP6 of inverter 24.

Consider a voltage signal with a rising edge arriving at the input Vin, such that the low state of the input Vin changes to a high state i.e. approximately V+. In such a situation transistor MP1 turns-off and transistor MN1 turns-on, whilst the conduction states of transistors MP2 and MN2 remain the same during, and for some short period after, the state transitions of transistors MP1 and MN1. Also, transistors MP4 and MN4, within command stage 12, turn off and turn on, respectively.

Now that transistor MP1 has been turned off, there exists a high impedance path between the positive supply rail V+ and the base 14 of transistor TP1.

Since transistors MN1 and MN2 are both conducting, a low impedance path exists between the base 14 of transistor TP1 and the negative supply rail V−. As a consequence, transistor TP1 turns on. Thus, transistor TP1 supplies current to the output Vout and charges the input capacitance of inverter 24. The voltage at the output Vout will increase even though transistor MN5 is still conducting, since in practice, transistor TP1 is designed to source more current than transistor MN5 is designed to sink.

As the voltage at the output Vout rises, the output Vfb of inverter 24 goes low, which turns off transistors MN5 of inverter 26 and MN3 of command stage 12 and turns on transistors MP5 of inverter 26 and MP3 of command stage 12. Therefore, transistor MP5 provides a steady state low impedance path and low voltage drop between the positive supply rail V+ and the output Vout. The low state of the output Vfb of inverter 24 also turns off the N-MOS transistor MN2 of command stage 10 and turns on its P-MOS transistor MP2. Therefore, the PNP transistor TP1 is turned off, since its base 14 is at a voltage of approximately V+.

With a circuit of the type illustrated in FIG. 1, the rise time of the output signal Vout is primarily dependant upon the switching speed of the output PNP transistor TP1: the switching speed of transistor TP1 is affected by such device parameters as the current gain-bandwidth product (Ft), parasitic capacitances, and parasitic resistances, which in turn are dependent upon the type of process used to fabricate the PNP transistor TP1.

Hiraki et al pointed out, in the above cited article, the practical drawback of using a low switching speed PNP transistor and recommends that a high performance PNP transistor be used to pull-up the output signal.

Hiraki et al state that in order to fabricate a practical (i.e. commercially viable) TS-FS-BiCMOS circuit, a pull-up PNP transistor with a high frequency performance, comparable to that of a pull-down NPN transistor, will be essential. This, Hiraki et al go on to state, entails using vertically processed NPN and PNP transistors for the output bipolar stage. However, it appears from the article that a vertically processed pull-up PNP transistor will complicate the fabrication process. The complexity of the fabrication process for introducing a vertically processed pull-up PNP transistor arises from the fact that the collector of this PNP transistor would need to be isolated from the substrate, and in order to achieve this, an isolated well would need to be created.

SUMMARY OF THE INVENTION

An object of the invention is to provide a pull-up circuit in which the pull-up rise time is comparable to the pull-down fall time without having to depend upon a high performance PNP transistor.

This object is achieved according to the invention by a pull-up circuit comprising an NPN bipolar transistor connected between an output terminal and a positive supply voltage, a P-MOS transistor connected in parallel with the NPN bipolar transistor, a first CMOS inverter receiving an input signal and controlling the gate of the P-MOS transistor, and a second CMOS inverter receiving the output of the first inverter and controlling the base of the NPN transistor.

The invention also provides an output stage comprising a pull-up circuit as described above, and a pull-down circuit comprising an N-MOS transistor connected between the output terminal and a negative supply voltage, a second NPN bipolar transistor connected in parallel with the N-MOS transistor, a control circuit for switching on the second NPN bipolar transistor when the input signal is such that the output terminal must be pulled down, and a third inverter whose input is connected to the output terminal and whose output controls the gate of the N-MOS transistor and provides an active high signal to the control circuit for switching off the second NPN bipolar transistor.

BRIEF DESCRIPTION OF THE DRAWINGS

One embodiment of the invention is described in detail below with reference to the drawings in which.

DETAILED DESCRIPTION

Figure 1:
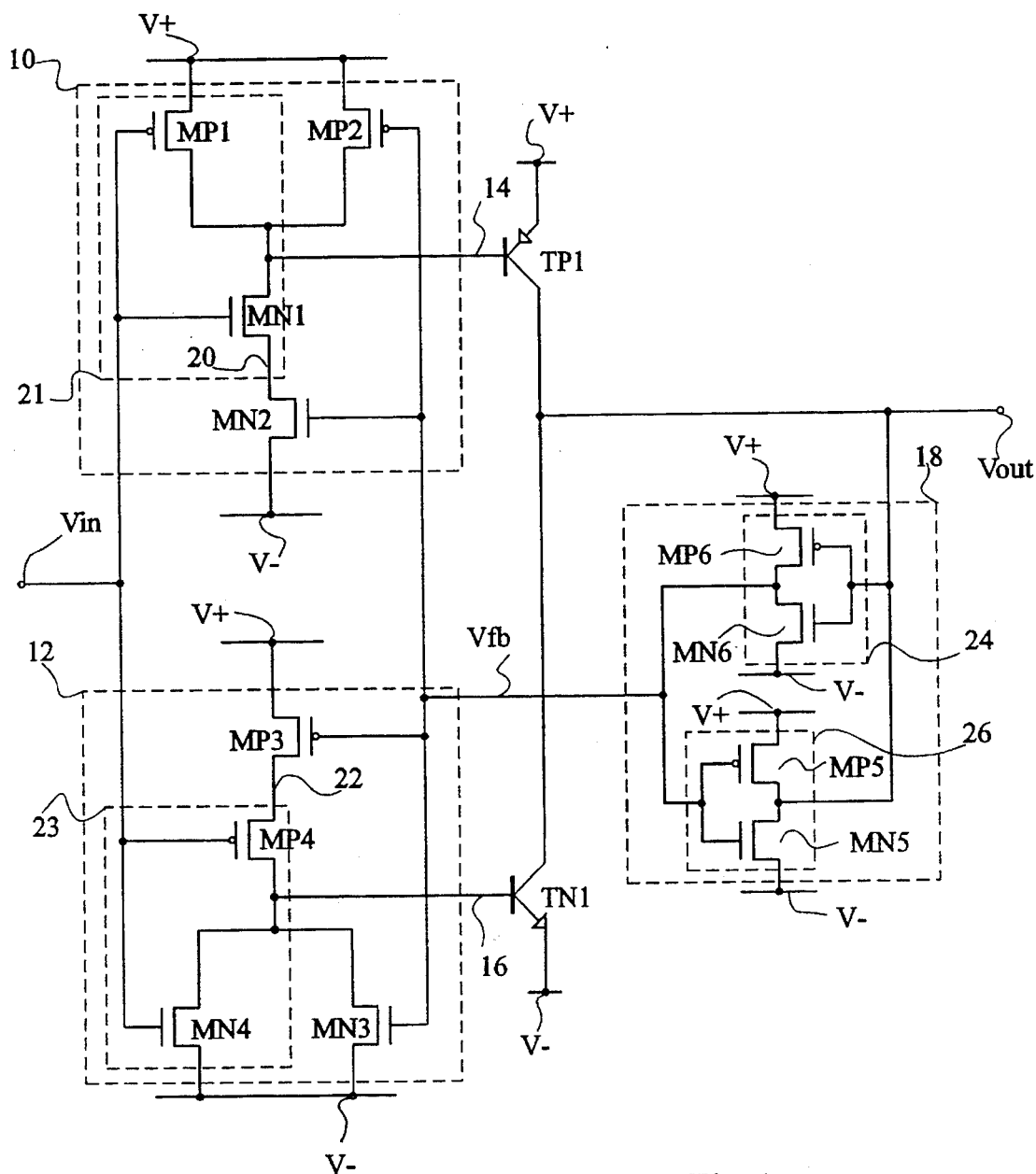
FIG. 1 illustrates a detailed circuit diagram of a conventional TS-FS-BiCMOS circuit.
Figure 2A:
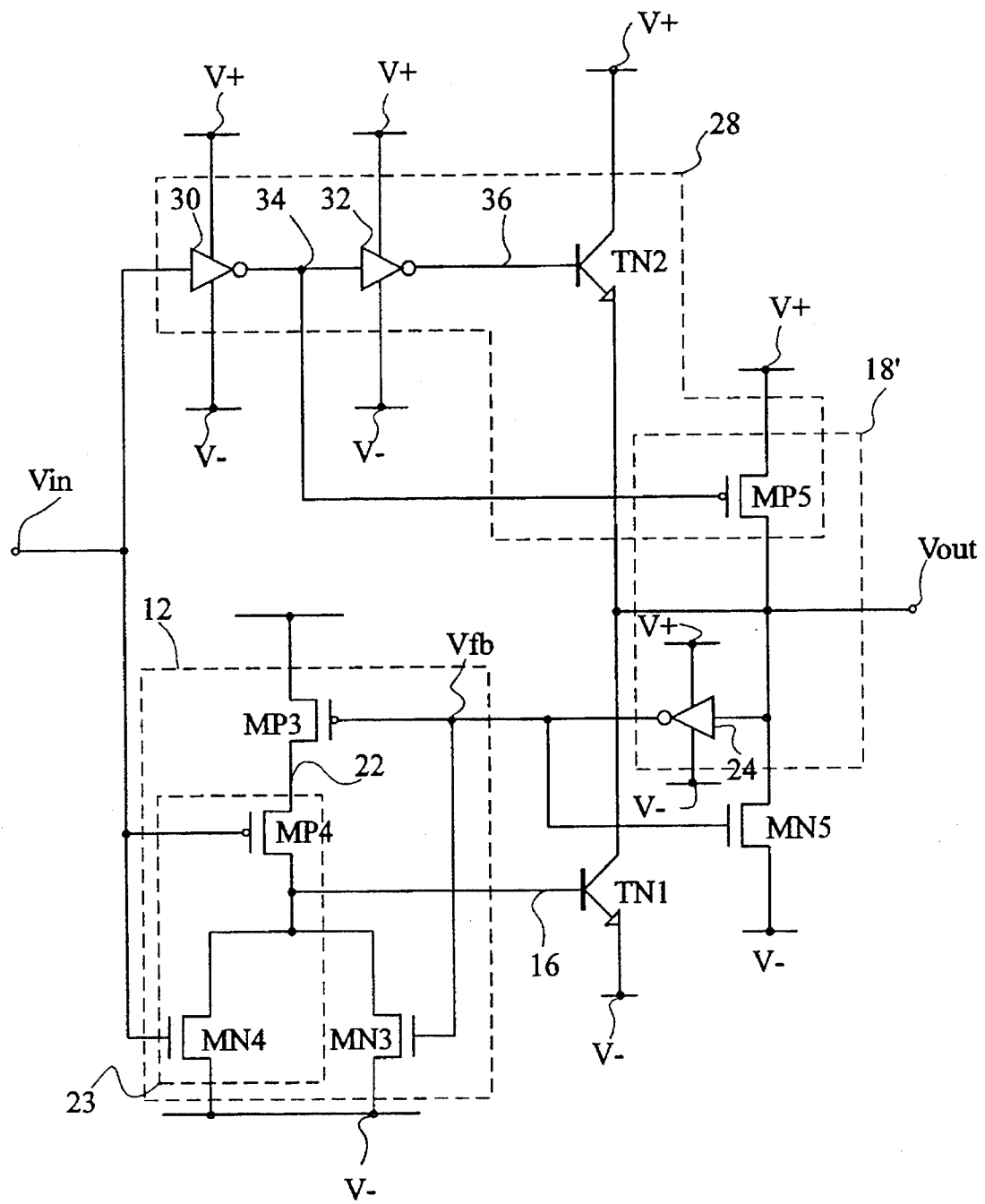
FIG. 2a illustrates a detailed circuit diagram of an embodiment of a TS-FS-BiCMOS circuit in accordance with the invention.

FIG. 2a illustrates the same command stage 12 and output pull-down NPN transistor TN1 as illustrated in FIG. 1 and described above. However, according to the invention, command stage 10 and the output pull-up PNP transistor TP1 are replaced by a combined CMOS and NPN pull-up circuit 28, and the electrical connections of the output latch 18, hereafter referred to as 18', have been modified.

The combined CMOS and NPN pull-up circuit 28 comprises an NPN bipolar pull-up transistor TN2 which replaces the pull-up PNP transistor TP1 illustrated in FIG. 1. The collector and emitter of transistor TN2 are connected to the positive supply rail V+ and to the output terminal Vout, respectively. Transistor TN2 is controlled by two cascades inverters 30 and 32, connected succesively between the input terminal Vin and the base of transistor TN2.

The gate terminal of transistor MP5 of latch 18', instead of being connected to the output Vfb of inverter 24 as in latch 18 of FIG. 1, is connected to the output 34 of inverter 30.

Figure 2B:
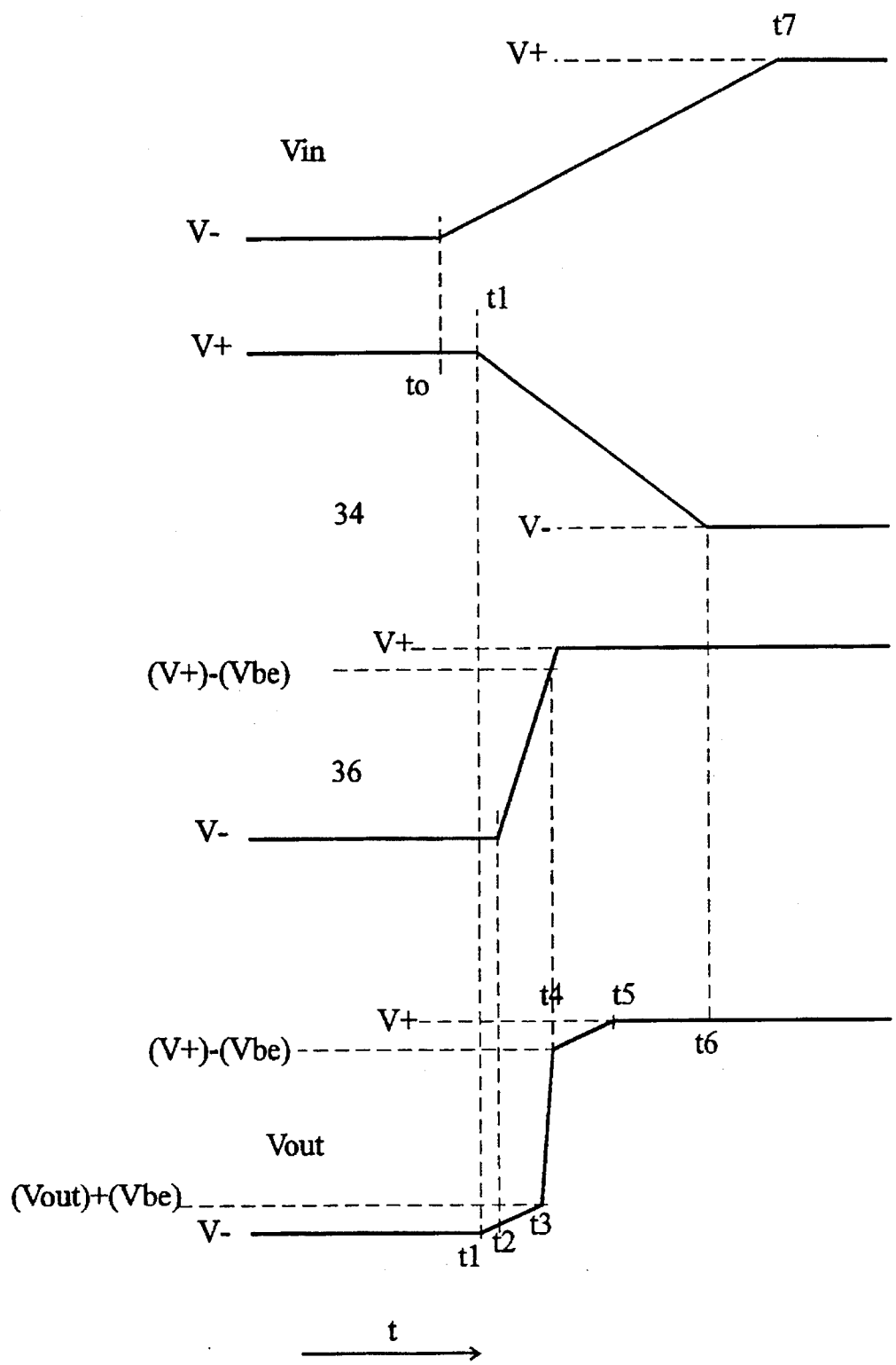
FIG. 2b illustrates voltage waveforms of an embodiment of a TS-FS-BiCMOS circuit in accordance with the invention during an output pull-up transition.

Referring to FIG. 2b, before a time t0, it is assumed that the voltages at the input Vin and output Vout are at a steady low state, the output 34 of inverter 30 is held high and the output 36 of inverter 32 is held low. Thus, transistors TN2 and MP5 are both non-conducting. The output Vout is held low by the N-MOS transistor MN5, which is controlled by the output Vfb of inverter 24.

At time t0, a voltage signal with a rising edge arrives at the input Vin such that the low state of the input Vin starts to change to a high state. Transistors MP4 and MN4, within command stage 12, start to turn off and turn on, respectively.

At a time t1, a short period after time t0, the output 34 of inverter 30 starts to change from a high state to a low state and transistor MP5 starts to turn on which causes the voltage at the output Vout to start increasing.

At a time t2, a short period after time t1, the output 36 of inverter 32 starts to change from a low state to a high state. Inverter 32 is designed such that its output 36 changes rapidly from a low state to a high state. This rapid transition is facilitated by the emitter-follower configuration of transistor TN2, which provides a low capacitive load for inverter 32 to drive.

At a time t3, a short period after time t2, as soon as the voltage at the output 36 of inverter 32 is approximately one base-emitter diode drop (Vbe) above the voltage at the output Vout, the voltage at the output Vout also starts to change rapidly from a low state to a high state, since the pull-up NPN transistor TN2 then operates as an emitter follower.

The voltage at the output Vout increases rapidly even though transistor MN5 is still conducting, since in practice, transistor TN2 will be designed to source more current than transistor MN5 is designed to sink.

As the voltage at the output Vout rises, the output Vfb of inverter 24 goes low, which turns off transistors MN5 and MN3, and turns on transistor MP3.

At a time t4, a short period after time t3, transistor TN2 has pulled-up the voltage at the output Vout to the value of the positive supply rail V+ minus approximately a base-emitter diode drop (Vbe).

At a time t5, transistor MP5 is fully turned on and provides the low impedance and low voltage drop between the positive supply rail V+ and the output Vout. Transistor TN2 switches off since its base-emitter voltage is then approximately zero.

At times t6 and t7, the output 34 of inverter 30 reaches the voltage V− and the input Vin reaches the voltage V+, respectively.

Now consider a voltage signal with a falling edge arriving at the input Vin such that the high state of the input Vin changes to a low state. The pull-down operation of the circuit is identical to that of the control circuit 12 and latch 18' of FIG. 1. Moreover, the output 34 of inverter 30 goes high, switching off transistor MP5, and the output 36 of inverter 32 goes low, switching transistor TN2 off. The output Vout is pulled-down more rapidly than in the conventional circuit of FIG. 1 because the switching on of transistors MN5 and TN1 are not hindered by transistor MP5 which is switched off by inverter 30.

According to the invention, there is no requirement to transiently-saturate the pull-up NPN transistor TN2, since it is configured as an emitter follower. Indeed, a transistor configured as an emitter follower is generally well known for its fast switching capabilities in comparison to other transistor configurations.

An emitter follower is normally adversely affected by a capacitive load during turn off. However, with this circuit arrangement a very low impedance path from the output Vout to the negative supply V− is provided by transistors TN1 and MN5 during the turn off of transistor TN2. This low impedance path facilitates the discharge of the capacitive load and improves the turn off time of transistor TN2.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A BiCMOS output stage comprising:

a first NPN bipolar transistor connected between an output terminal and a positive supply voltage;

a first P-MOS transistor connected in parallel with the first NPN bipolar transistor;

a first inverter receiving an input signal and controlling a gate of the first P-MOS transistor;

a second inverter receiving the output of the first inverter for controlling a base of the first NPN transistor;

a first N-MOS transistor connected between the output terminal and a negative supply voltage;

a second NPN bipolar transistor connected in parallel with the first N-MOS transistor;

a control circuit for switching on said second NPN transistor when said input signal is such that said output terminal must be pulled down; and a third inverter having an input connected to the output terminal and whose output controls the gate of said first N-MOS transistor and provides an active high signal to said control circuit for switching off said second NPN bipolar transistor.

2. A BiCMOS output stage according to claim 1, wherein the control circuit comprises:

second and third series connected P-MOS transistors and second and third parallel connected N-MOS transistors;

a source of the second P-MOS transistor being connected to said positive supply voltage;

drains of the second and third N-MOS transistors being connect to a drain of the third P-MOS transistor and to a base of the second NPN transistor;

sources of the second and third N-MOS transistors being connected to said negative supply voltage;

gates of the second N-MOS and P-MOS transistors being connected to the output of the third inverter; and gates of the third N-MOS and P-MOS transistors being connected to receive the input signal.

3. The output stage according to claim 2 wherein the output stage operates with a voltage difference of less than 2 V between the positive and negative supply voltages.

4. The output stage according to claim 1 wherein the output stage operates with a voltage difference of less than 2 V between the positive and negative supply voltages.

5. An output stage that receives an input signal to provide an output signal to a load, the output stage comprising:

an input terminal that receives the input signal;

an output terminal coupled to the load that provides the output signal;

a pulldown circuit that discharges the output terminal with a pulldown fall time when the input signal assumes a first state, the pulldown circuit including:

a pulldown first transistor device, coupled to the output terminal and responsive to a first control signal, that turns on when the input signal assumes the first state and that has a first impedance when turned on, the pulldown first transistor device discharging the load with a pulldown fall time, and turning off when the output signal substantially reaches the steady state;

a pulldown second transistor device, coupled to the output terminal and responsive to a second control signal, that remains on when the pulldown first transistor device turns off, the pulldown second transistor device having a second impedance when turned on that is lower than the first impedance; and a pulldown control circuit coupled to the input terminal, the pulldown first transistor device, the pulldown second transistor device, and the output terminal, that turns the pulldown first transistor device and the pulldown second transistor device on when the input signal assumes the first state and that turns the pulldown first transistor device off while maintaining the pulldown second transistor device on after the output signal substantially reaches the steady state, by providing the first control signal and the second control signal;

a pullup circuit that charges the output terminal with a pullup rise time when the input signal assumes a second state; and wherein the pullup rise time is substantially equal to the pulldown fall time.

6. The output stage according to claim 5 wherein the pulldown first transistor device is a NPN bipolar junction transistor.

7. The output stage according to claim 5 wherein the pullup circuit comprises:

a pullup first transistor device, coupled to the output terminal and responsive to a first control signal, that turns on when the input signal assumes the second state, the pullup first transistor device charging the load with the pullup rise time, and turning off when the output signal substantially reaches a steady state.

8. The output stage according to claim 7, wherein the pullup first transistor device has a first impedance when turned on, the pullup circuit further comprising:

a pullup second transistor device, coupled to the output terminal and responsive to a second control signal, that remains on when the pullup first transistor device turns off, the pullup second transistor device having a second impedance when turned on that is lower than the first impedance; and a pullup control circuit coupled to the input terminal, the pullup first transistor device, and the pullup second transistor device, that turns the pullup first transistor device and the pullup second transistor device on when the input signal assumes the second state and that turns the pullup first transistor device off while maintaining the pullup second transistor device on after the output signal substantially reaches the steady state, by providing the first control signal and the second control signal.

9. The output stage according to claim 14 wherein the pullup control circuit comprises:

a first inverter coupled to the input terminal and the pullup second transistor device, the first inverter providing the second control signal that maintains the pullup second transistor device on when the pullup first transistor device turns off; and a second inverter coupled between the first inverter and the pullup first transistor device, the second inverter providing the first control signal that turns the pullup first transistor device on when the input signal assumes the second state and that turns the pullup first transistor device off when the output signal substantially reaches the steady state.

10. The output stage according to claim 8 wherein the pullup second transistor device is a P-MOS transistor.

11. The output stage according to claim 10 wherein the pullup first transistor device is a NPN bipolar junction transistor.

12. The output stage according to claim 11 wherein the pullup control circuit comprises:

a first inverter coupled to the input terminal and a gate terminal of the P-MOS transistor, the first inverter providing the second control signal that maintains the P-MOS transistor on when the NPN bipolar transistor turns off; and a second inverter coupled between the first inverter and a base terminal of the NPN bipolar junction transistor, the second inverter providing the first control signal that turns the NPN transistor on when the input signal assumes the second state and that turns the NPN transistor off when the output signal substantially reaches the steady state.

13. The output stage according to claim 7 wherein the pullup first transistor device is a NPN bipolar junction transistor.

14. The output stage according to claim 5 wherein the pulldown second transistor device is a N-MOS transistor.

15. The output stage according to claim 14 wherein the pulldown first transistor device is a NPN bipolar junction transistor.

16. The output stage according to claim 15 wherein the pulldown control circuit comprises:

an inverter coupled to the output terminal, the inverter providing a feedback signal; and a command circuit coupled between the input terminal and the inverter and coupled to a gate terminal of the N-MOS transistor and to a base terminal of the NPN bipolar junction transistor, that turns the NPN bipolar junction transistor and the N-MOS transistor on when the input signal assumes the first state and that receives the feedback signal to turn the NPN bipolar junction transistor off while maintaining the N-MOS transistor on after the output signal substantially reaches the steady state, by providing the first control signal and the second control signal.

17. The output stage according to claim 16 wherein the output stage operates at a supply voltage of less than 2 V.

18. The output stage according to claim 5 wherein the pulldown control circuit comprises:

an inverter coupled to the output terminal, the inverter providing a feedback signal; and a command circuit coupled between the input terminal and the inverter and coupled to the pulldown first transistor device and the pulldown second transistor device, that turns the pulldown first transistor device and the pulldown second transistor device on when the input signal assumes the first state and that receives the feedback signal to turn the pulldown first transistor device off while maintaining the pulldown second transistor device on after the output signal substantially reaches the steady state, by providing the first control signal and the second control signal.

19. The output stage according to claim 18 wherein the output stage operates at a supply voltage of less than 2 V.

20. The output stage according to claim 5 wherein the output stage operates at a supply voltage of less than 2 V.

21. A BiCMOS output stage comprising:

an input terminal for receiving an input signal;

an output terminal that provides an output signal;

a first bipolar transistor electrically coupled between the output terminal and a positive supply voltage;

a first MOS transistor electrically coupled in parallel with the first bipolar transistor;

a second bipolar transistor electrically coupled between the output terminal and a negative supply voltage, the second bipolar transistor having the same dominant charge carrier type as the first bipolar transistor;

a second MOS transistor electrically coupled in parallel with the second bipolar transistor;

means responsive to the input terminal for causing the first bipolar transistor to conduct during low-to-high transitions in the input signal, and to otherwise remain in a non-conducting state; and means responsive to the input terminal for causing the second bipolar transistor to conduct during high-to-low transitions in the input signal, and to otherwise remain in a non-conducting state.

22. The output stage of claim 21, wherein the means for causing the first bipolar transistor to conduct includes a first inverter having an input electrically coupled to the input terminal and an output electrically coupled to the first MOS transistor, and a second inverter having an input electrically coupled to the output of the first inverter and an output electrically coupled to the first bipolar transistor.

23. The output stage of claim 22, wherein the first and second bipolar transistors are NPN transistors.

24. The output stage according to claim 23 wherein the output stage operates with a voltage difference of less than 2 V between the positive and negative supply voltages.

25. The output stage according to claim 22 wherein the output stage operates with a voltage difference of less than 2 V between the positive and negative supply voltages.

26. The output stage of claim 21, wherein the first and second bipolar transistors are NPN transistors.

27. The output stage according to claim 26 wherein the output stage operates with a voltage difference of less than 2 V between the positive and negative supply voltages.

28. The output stage according to claim 21 wherein the output stage operates with a voltage difference of less than 2 V between the positive and negative supply voltages.

29. A method of buffering a signal, comprising:
  causing a first bipolar transistor electrically coupled between a positive supply voltage and a signal output node to conduct using a first type of dominant charge carrier during a low-to-high transition in the signal;
  also causing a first MOS transistor electrically connected in parallel with the first bipolar transistor to conduct during the low-to-high transition in the signal;
  causing the first bipolar transistor to cease conducting at the end of the low-to-high transition in the signal;
  causing a second bipolar transistor electrically coupled between a negative supply voltage and a signal output node to conduct using the first type of dominant charge carrier during a high-to-low transition in the signal;
  also causing a second MOS transistor electrically connected in parallel with the second bipolar transistor to conduct during the high-to-low transition in the signal; and
  causing the second bipolar transistor to cease conducting at the end of the high-to-low transition in the signal.

30. The method of claim 29 further including the steps of:
  inverting the signal to obtain an inverted signal;
  inverting the inverted signal to obtain a twice-inverted signal;
  employing the inverted signal to control the step of causing the first MOS transistor to conduct; and
  employing the twice inverted signal to control the step of causing the first bipolar transistor to conduct.

31. The method of claim 30 wherein the steps of causing the first and second bipolar transistors to conduct cause them to conduct using electrons as their dominant charge carrier.

32. The method of claim 31 wherein the steps of causing bipolar transistors to conduct operate with a voltage difference of less than 2 V between the positive and negative supply voltages.

33. The method of claim 30 wherein the steps of causing bipolar transistors to conduct operate with a voltage difference of less than 2 V between the positive and negative supply voltages.

34. The method of claim 30 wherein the steps of causing bipolar transistors to conduct operate with a voltage difference of less than 2 V between the positive and negative supply voltages.

35. The method of claim 30 wherein the steps of causing the first and second bipolar transistors to conduct cause them to conduct using electrons as their dominant charge carrier.

36. The method of claim 35 wherein the steps of causing bipolar transistors to conduct operate with a voltage difference of less than 2 V between the positive and negative supply voltages.

* * * * *